United States Patent [19]

Lehnhoff et al.

[11] Patent Number: 4,970,620
[45] Date of Patent: Nov. 13, 1990

[54] FET BRIDGE PROTECTION CIRCUIT

[75] Inventors: Richard N. Lehnhoff, Kettering; Robert J. Disser, Dayton, both of Ohio

[73] Assignee: General Motors Corporation, Detroit, Mich.

[21] Appl. No.: 397,210

[22] Filed: Aug. 23, 1989

[51] Int. Cl.⁵ .............................................. H03K 17/60
[52] U.S. Cl. ........................................ 361/18; 361/56; 361/89; 363/56; 323/289; 307/570; 307/262; 307/300
[58] Field of Search ............... 361/18, 56, 89; 363/56; 323/289; 307/300, 262, 263, 570

[56] References Cited

U.S. PATENT DOCUMENTS

| | | | |
|---|---|---|---|
| 4,316,243 | 2/1982 | Archer | 307/570 |
| 4,485,434 | 11/1984 | Beeston et al. | 363/132 |
| 4,566,059 | 1/1986 | Gallios et al. | 363/17 |
| 4,607,322 | 8/1986 | Henderson | 363/56 |
| 4,680,664 | 7/1987 | Leuthen | 361/91 |
| 4,742,208 | 5/1988 | Overman | 219/137 PS |
| 4,783,714 | 11/1988 | Kalina | 361/101 |
| 4,829,415 | 5/1989 | Haferl | 363/56 |

Primary Examiner—Todd E. DeBoer
Attorney, Agent, or Firm—Mark A. Navarre

[57] ABSTRACT

An FET bridge protection circuit preventing shoot-through caused from both FETs being biased on at the same time, while also maximizing the frequency at which the bridge output can alternate between high and low is described.

2 Claims, 2 Drawing Sheets

FET BRIDGE PROTECTION CIRCUIT

This invention relates to an electronic apparatus for providing shoot-through protection for FET bridge circuits.

Background of the Invention

FET bridges often serve as the controls for the on-off states of power sources for high-power loads. FETs are useful because they saturate easily, turning on quickly, and require little power to do so. In the operation of the bridge circuit, when one FET is biased on, the output is high, when the other FET is biased on, the output is low. The drawback to the bridge configuration is that if there is a synchronous on state of the FETs, both FETs biased on at the same time, even for a fraction of a second, there will be a current surge, or shoot-through, in the circuit. This current surge can be enough to blow the FETs and damage other parts of the circuit. Consequently, to avoid these current surges, both FETs are usually turned off for a short while before the next is turned on. The problem this causes is that it slows down the rate at which the FETs can be turned on and off, and consequently the rate at which the power circuit can be turned on or off.

Summary of the Present Invention

The present invention is directed to an improved shoot-through protection circuit which prevents the synchronous on state of both FETs in the bridge, while also maximizing the frequency at which the bridge output can alternate between high and low. The present invention, although not limited to FET bridges, is aimed at providing the above two accomplishments for FET bridges. The invention alternately turns one FET on and one FET off. A direct path is provided to the gate of the FET being turned off to allow the gate to discharge as fast as possible, therefore allowing it to turn off as fast as possible. A timing means is used to lengthen the turn-on time of the FET being turned on, making the turn-on times longer than the turn-off times. Since the turn-off time of the FET being turned off is shorter than the turn-on time of the FET being turned on, there is no overlap in which both FETs are turned on, and therefore no shoot-through of current across the circuit. The timing means can be adjusted so that a maximum frequency of safe operation of the bridge circuit can be achieved.

Detailed Description of the Drawings

Figure 1:
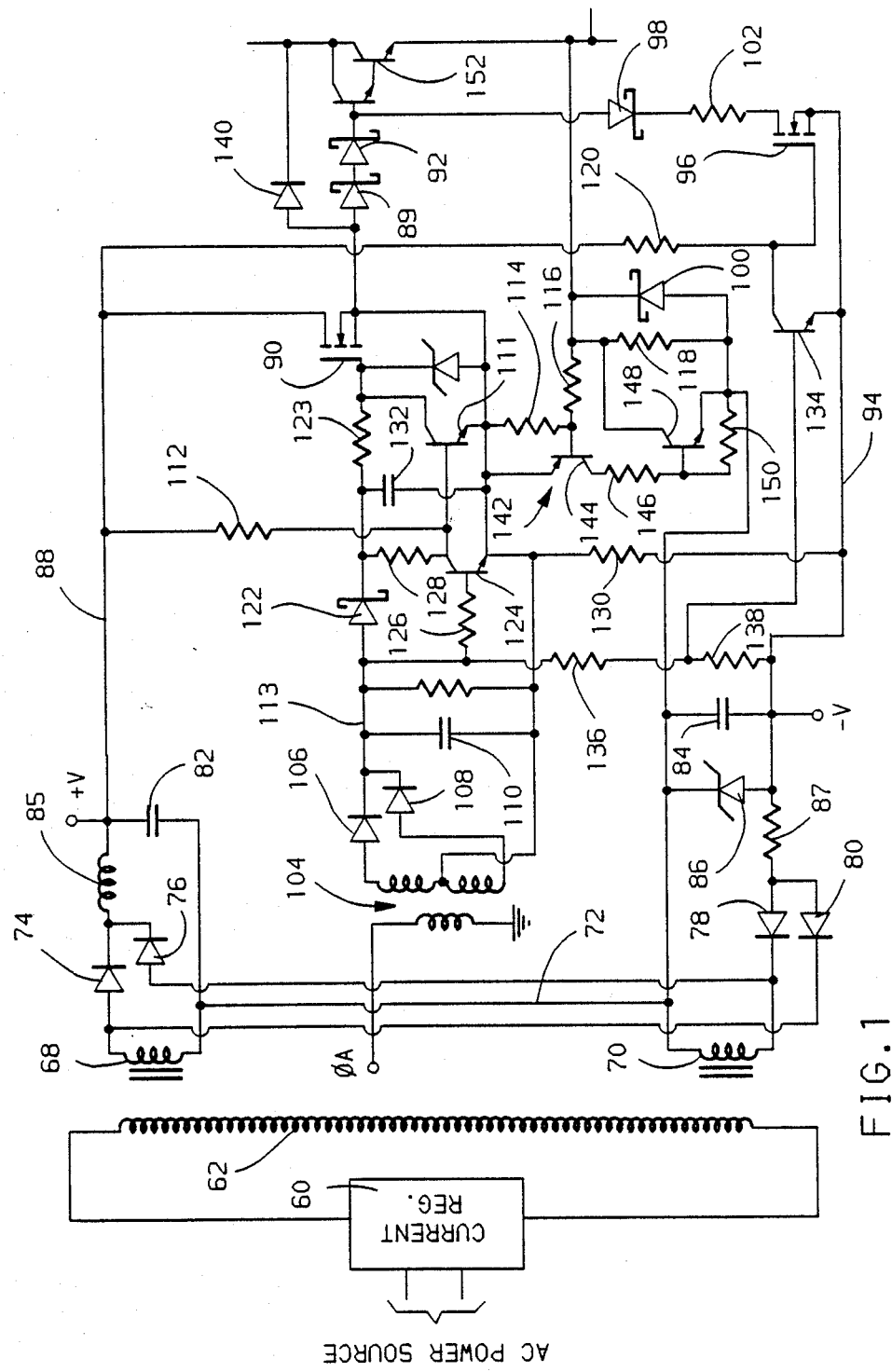
FIG. 1 is a circuit diagram of one embodiment of the invention. The diagram shows the protection circuit of this invention connected to a transformer for power, an input means, and a drive means for a load.

FIG. 1 shows the invention implemented in a circuit used for driving a transistor controlled power source. The circuit in FIG. 1 was previously disclosed in copending U.S. patent application, Ser. No. 338,821, filed Apr. 17, 1989, and assigned to the assignee of the present invention. The circuit was used in that application as part of a control circuit for a transistor bridge inverter for multiple phase AC machines.

This circuit uses two N-channel FETs, 90 and 96, in the bridge. Power is supplied to the circuit from an AC power source through the current regulator 60. A full detailed description of the current regulator 60 is provided in the above copending patent application Ser. No. 338,821. The current regulator 60 supplies power to the primary coil 62 of a transformer. The secondary coils 68 and 70 of the transformer are connected, using the diodes 74, 76, 78, 80 and 86, along with capacitors 82 and 84, resistor 87, and inductor 85, to provide power to the rest of the circuit through line 88, the +V supply bus, and line 94, the −V supply bus. Resistor 130 connects the center tap of transformer 104 and −V supply bus 94.

A modulated control signal is applied to the isolation transformer 104, then demodulated by the diodes 106 and 108, and filtered by the capacitor 110. The result is a digital waveform on line 113.

When the signal on line 113 is logically low, transistor 111 is biased conductive via resistor 112. When the transistor 111 is biased conductive, the gate of FET 90 is discharged via transistor 111 biasing the drain to source circuit of FET 90 nonconductive. At the same time, FET 96 is biased conductive via the resistor 120 which is connected to the +V supply bus 88. In this state, the bridge transistor 152 is biased nonconductive through schottky diode 98 and resistor 102.

When the signal on line 113 is logically high, however, FET 90 is biased conductive via schottky diode 122 and resistor 123. At this point, transistor 124 is biased conductive via resistor 126, causing a voltage drop across resistor 128 and turning off transistor 111. In addition, the transistor 134 is biased conductive via the divider resistors 136 and 138 to turn off FET 96. In this state, the bridge transistor 152 is biased on, with the diode 140 cooperating with the schottky diodes 89 and 92 to keep the bridge transistor 152 out of deep saturation.

The above circuit prevents any overlap in the conduction periods of the power FETs 90 and 96. At the initiation of the bias-on signal, the gate capacitance of FET 96 is discharged at a relatively fast rate through the collector-emitter circuit of transistor 134 for relatively quick turn-off of FET 96. The turn-off rate of FET 96 is about as fast as possible because the collector-emitter circuit of transistor 134 provides a direct path for the discharge of the gate capacitance of FET 96. This helps increase the frequency at which the circuit can be operated. At the same time that the gate capacitance of FET 96 is discharged, the gate capacitance of FET 90 is charged at a relatively slow rate through the resistor 123 for a relatively slow turn-on of the FET 90. Since the turn-on time of FET 90 is longer than the turn-off time of FET 96, there is no overlap in the conductive periods of the two FETs.

At the initiation of the bias-off signal, the gate capacitance of FET 90 is discharged at a relatively fast rate through the collector-emitter circuit of transistor 111 for relatively quick turn-off of the FET 90. As with the FET 96, the turn-off rate of FET 90 is about as fast as possible because the collector-emitter circuit of the transistor 111 provides a direct path for the discharge of the gate capacitance of FET 90. While the gate capacitance of FET 90 is discharged, the gate capacitance of FET 96 is charged at a relatively slow rate through the resistor 120 for a relatively slow turn-on time of FET 96. As above, since the turn-on time of FET 96 is longer than the turn-off time of FET 90, there is no overlap in the conductive periods of the two FETs.

The above circuit arrangement allows the FET pair 90 and 96 to be driven at a higher frequency. The turn-off time of each FET is about as short as the physical characteristics of the FETs will allow. This is because of the direct discharge paths for the gate capacitances of the FETs through the collector-emitter circuits of transistors 111 and 134. The turn-on time of the FETs is controlled by the resistors 120 and 123. Each resistor is connected in series with the gate capacitance of one of the FETs, acting to slow the charge rate of the gate capacitances, in turn slowing the turn-on rates of the FETs. The limitation required here for the invention to operate properly is that the turn-on times of the FETs must be longer than the turn-off times. Therefore, the values of resistors 120 and 123 can be adjusted so that the turn-on rates of the FETs are as fast as possible, while at the same time remaining slower than the turn-off rates. Such an adjustment will allow the circuit to be run at the maximum possible frequencies.

The circuit elements designated generally by the reference numeral 142, including transistors 144 and 148, resistors 114, 116, 146, 150 and 118, and schottky diode 100, comprise an impedance matching circuit for maintaining the effective base-emitter input impedance of bridge transistor 152 when the lagging power factor of the load (not shown) causes transistor 152 to be reverse biased during its on-period. The operation of circuit 142 is described in detail in the above mentioned copending application.

Figure 2:
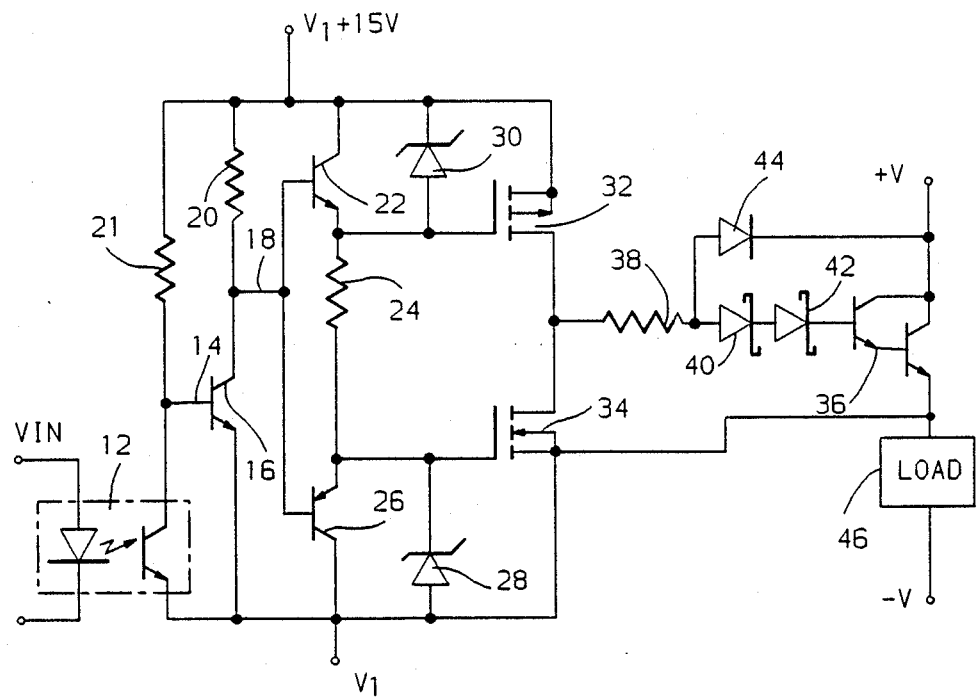
FIG. 2 is a circuit diagram of another embodiment of the invention, this embodiment having fewer components. The diagram shows the protection circuit connected to an input signal and an FET bridge which is used to drive a power supply for a load.

In FIG. 2, the invention is shown implemented in another circuit. This embodiment uses a complementary pair of FETs, 32 and 34, in a bridge. The figure shows the circuit driving a power transistor 36, which drives a load 46.

An input signal is applied to the circuit through an optical coupler 12. When the signal on line 14 is logically low, transistor 16 is biased nonconductive. When transistor 16 is biased nonconductive, the signal on line 18 is logically high via resistor 20; this biases NPN transistor 22 conductive and PNP transistor 26 nonconductive. This causes P-channel FET 32 to turn off immediately because of the direct discharge path for the gate capacitance of FET 32 through the emitter-collector circuit of transistor 22. Resistor 24, together with transistor 22, provide a path for N-channel FET 34 to turn-on at this time, but at a slower rate because the resistor 24 delays the rate at which the gate capacitance of FET 34 can charge. Zener diode 28 protects FET 34 by restricting the gate to source voltage.

When the signal on line 14 is logically high, transistor 16 is biased conductive via resistor 21. At this point, the signal on line 18 is logically low, biasing transistor 26 conductive and transistor 22 nonconductive. This causes FET 34 to turn off immediately because of the direct discharge path for the gate capacitance of FET 34 through the emitter-collector circuit of transistor 26. Resistor 24, together with transistor 26, provide a path for FET 32 to turn on at this time, but at a slower rate because the resistor 24 delays the rate at which the gate capacitance of the FET 32 can charge. Zener diode 30 protects FET 32 by restricting the source to gate voltage. With this arrangement, because the turn-on times of the FETs are longer than the turn-off times, the circuit does not allow shoot-through caused by the FETs 32 and 34 being turned on at the same time. Adjusting resistor 24 to shorten the turn-on times of the FETs, but keeping the turn-on times longer than the turn-off times, allows the circuit to operate at increased frequencies.

When FET 32 is turned on, the base of power transistor 38 is brought high through resistor 38 and schottky diodes 40 and 42, providing power for the load 46. Diode 44 operates in connection with the schottky diodes 40 and 42 to keep the power transistor 36 out of deep saturation.

The above two embodiments are just two implementations of the invention. The invention does not need to appear as in the above two circuits. The invention can be applied in other circuits and can be used in circuits driving a wide variety of loads.

The embodiments of the invention in which an exclusive property or privilege is claimed are defined as follows:

1. A protection circuit with an FET bridge comprising:

a complementary pair of FETs, one N-channel and one P-channel, each FET having a drain, a gate, and a source, each FET also having an on state and an off state, the FET bridge connected across a power supply with a positive and a negative terminal, the P-channel FET having the source connected to the positive terminal of the power supply, the N-channel FET having the source connected to the negative terminal of the power supply, the drain of the two FET's connected together and providing an output signal for driving a power transistor; and two transistors, one PNP and one NPN, each having a base, an emitter, and a collector, the emitters of the transistors connected together through a resistor, the transistors also connected in such a way that when one transistor is biased conductive, the other transistor is biased nonconductive, the transistors further connected in a way such that when the PNP transistor is biased conductive, the N-channel FET turns off, the gate discharging directly through the collector-emitter circuit of the PNP transistor, and the P-channel FET turns on, the gate charging through the PNP transistor and the resistor, at a slower rate than the N-channel FET is discharging, the transistors further connected in a way such that when the NPN transistor is biased conductive, the P-channel FET turns off, the base discharging directly through the collector-emitter circuit of the NPN transistor, and the N-channel FET turns on, the gate charging, at a slower rate than the P-channel FET is discharging, through the NPN transistor and the resistor.

2. A protection circuit with a bridge circuit comprising:

a pair of switching devices, each having an on state, an off state, a turn-on time, and a turn-off time, comprising the bridge circuit and connected across a power source with high and low voltage terminals, one switching device coupled to the high voltage terminal, the other switching device coupled to the low voltage terminal, the two switching devices also connected together and providing an output signal at such connection;

two transistors, each with a collector-emitter circuit, for controlling the on/off states of the switching devices, the transistors connected such that when one transistor is biased conductive, the other transistor is biased nonconductive, the transistors also connected such that when one transistor is biased conductive, one switching device turns off, discharging directly through the collector-emitter circuit of the biased-conductive transistor, the transistors further connected such that when the other transistor is biased conductive, the other switching device turns off, discharging directly through the collector-emitter circuit of the biased-conductive transistor; and a single resistor, coupled to both of the switching devices, comprising part of a circuit path to both switching devices through which each switching device is turned on while the other is turned off, each switching device having a discharge path not including the resistor, the resistor lengthening the turn-on time of the switching device being turned on to a time of greater duration than the turn-off time of the switching device being turned off, thereby preventing both switching devices from being turned on at the same time.

* * * * *